(12) United States Patent
Pillarisetty et al.

(10) Patent No.: US 9,035,387 B2
(45) Date of Patent: May 19, 2015

(54) MULTI-GATE DEVICE

(71) Applicant: Intel Corporation, Santa Clara, CA (US)

(72) Inventors: Ravi Pillarisetty, Portland, OR (US); Brian Doyle, Portland, OR (US); Titash Rakshit, Hillsboro, OR (US); Jack Kavalieros, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 14/089,101

(22) Filed: Nov. 25, 2013

(65) Prior Publication Data

US 2014/0097495 A1    Apr. 10, 2014

Related U.S. Application Data

(63) Continuation of application No. 12/895,954, filed on Oct. 1, 2010, now Pat. No. 8,618,609, which is a continuation of application No. 12/049,079, filed on Mar. 14, 2008, now Pat. No. 8,280,909.

(51) Int. Cl.
*H01L 29/66* (2006.01)
*H01L 29/78* (2006.01)

(52) U.S. Cl.
CPC ...... *H01L 29/7855* (2013.01); *H01L 29/66545* (2013.01); *H01L 29/66795* (2013.01); *H01L 29/7849* (2013.01); *H01L 29/785* (2013.01)

(58) Field of Classification Search
CPC ............... H01L 29/66545; H01L 29/6679; H01L 29/7855; H01L 29/785; H01L 29/7849
USPC .................... 257/365, 193, E29.255
See application file for complete search history.

(56) References Cited

U.S. PATENT DOCUMENTS

| | | | |
|---|---|---|---|
| 6,583,469 B1 | 6/2003 | Fried et al. | |
| 7,098,477 B2 | 8/2006 | Zhu et al. | |
| 7,279,375 B2 | 10/2007 | Radosavljevic et al. | |
| 7,531,837 B2 * | 5/2009 | Liu | 257/59 |
| 7,629,643 B2 | 12/2009 | Pillarisetty et al. | |
| 7,737,506 B2 * | 6/2010 | Isobe et al. | 257/391 |
| 7,820,512 B2 | 10/2010 | Pillarisetty et al. | |
| 7,825,437 B2 | 11/2010 | Pillarisetty et al. | |
| 8,030,163 B2 | 10/2011 | Pillarisetty et al. | |
| 8,618,609 B2 | 12/2013 | Doyle et al. | |
| 2004/0036126 A1 | 2/2004 | Chau et al. | |
| 2004/0038126 A1 | 2/2004 | Gu | |
| 2006/0046448 A1 | 3/2006 | Barns et al. | |
| 2006/0138561 A1 | 6/2006 | Seo et al. | |
| 2007/0015323 A1 * | 1/2007 | Isobe et al. | 438/161 |
| 2008/0308861 A1 | 12/2008 | Nawaz | |
| 2008/0311714 A1 | 12/2008 | Doris et al. | |
| 2009/0166743 A1 | 7/2009 | Pillarisetty et al. | |

\* cited by examiner

*Primary Examiner* — Nikolay Yushin
(74) *Attorney, Agent, or Firm* — Winkle, PLLC

(57) ABSTRACT

Embodiments of an apparatus and methods for improving multi-gate device performance are generally described herein. Other embodiments may be described and claimed.

9 Claims, 10 Drawing Sheets

US 9,035,387 B2

MULTI-GATE DEVICE

CLAIM OF PRIORITY

The present application is a continuation of U.S. patent application Ser. No. 12/895,954, entitled "APPARATUS AND METHODS FOR IMPROVING MULTI-GATE DEVICE PERFORMANCE" filed on Oct. 1, 2010, which is a continuation of U.S. patent application Ser. No. 12/049,079, entitled "APPARATUS AND METHODS FOR IMPROVING MULTI-GATE DEVICE PERFORMANCE" filed on Mar. 14, 2008, now U.S. Pat. No. 7,833,889, Issue Date Nov. 16, 2010.

FIELD OF THE INVENTION

The field of invention relates generally to the field of semiconductor integrated circuit manufacturing and, more specifically but not exclusively, relates to multi-gate devices with reduced external parasitic contact resistance and increased channel mobility enhancement.

BACKGROUND INFORMATION

In a conventional metal oxide semiconductor field effect transistor (MOSFET), the source, channel, and drain structures are constructed adjacent to each other within the same plane. Typically, a gate dielectric is formed on the channel area and a gate electrode is deposited on the gate dielectric. The transistor is controlled by applying a voltage to the gate electrode, thereby allowing a current to flow through the channel between source and drain.

An alternative to methods of building planar MOSFETs has been proposed to help alleviate some of the physical barriers to scaling down existing designs. The alternative method involves the construction of three dimensional MOSFETs, in the form of a multi-gate transistor such as a dual-gate field effect transistor (FinFET) or a tri-gate transistor field effect transistor, as a replacement for the conventional planar MOSFET.

Three-dimensional transistor designs such as the FinFET and the tri-gate field effect transistor allow tighter packing of the same number of transistors on a semiconductor chip by using vertical or angled surfaces for the gates. A tri-gate field effect transistor comprises three substantially equal length gates situated on three exposed surfaces of a diffused body whereas a FinFET comprises two equal length gates situated along the sides of a narrow diffused body, or fin.

BRIEF DESCRIPTION OF THE DRAWINGS

The present invention is illustrated by way of example and not as a limitation in the figures of the accompanying drawings, in which.

DETAILED DESCRIPTION

An apparatus and methods for improving multi-gate device performance are described in various embodiments. In the following description, numerous specific details are set forth such as a description of a method to fabricate a plurality of multi-gate fins from a diffused body of a substantially planar structure that is substantially electrically isolated using a shallow trench region.

It would be an advance in the art of semiconductor manufacturing to reduce the parasitic contact resistance of a multi-gate transistor while increasing electron and/or hole mobility in a transistor channel through strain engineering. Strain engineering refers to a general strategy employed in semiconductor manufacturing to enhance device performance. Performance benefits are achieved by modulating strain in a transistor channel, which enhances electron mobility (or hole mobility) and thereby conductivity through the channel, in one embodiment, by stretching atoms within the channel beyond their normal interatomic distance. This can result in better device performance and lower energy consumption. Reducing parasitic contact resistance of a transistor also reduces energy that would otherwise be wasted in the form of heat, resulting in a lower operating cost for the device consumer. As a result, the semiconductor device operates at a lower temperature, reducing an amount of cooling that may need to be applied. In other cases, reducing parasitic contact resistance can provide for a more robust semiconductor device by reducing a voltage necessary to operate the device.

One such method involves providing a substrate comprising a sacrificial gate over a shallow trench region and a diffused body. A barrier layer is deposited on the shallow trench region, the diffused body, and the sacrificial gate. The barrier layer is eroded, polished, etched, and/or planarized to expose the sacrificial gate. The sacrificial gate is etched to form a recess in the barrier layer. A dielectric layer is deposited in the recess and a multi-fin mask is formed over the diffused body. The dielectric layer and diffused body are etched using the multi-fin mask to form a plurality of multi-gate fins. Isolation regions are formed adjacent to the plurality of multi-gate fins and a gate stack is formed over the isolation regions and the plurality of multi-gate fins.

Figure 1:
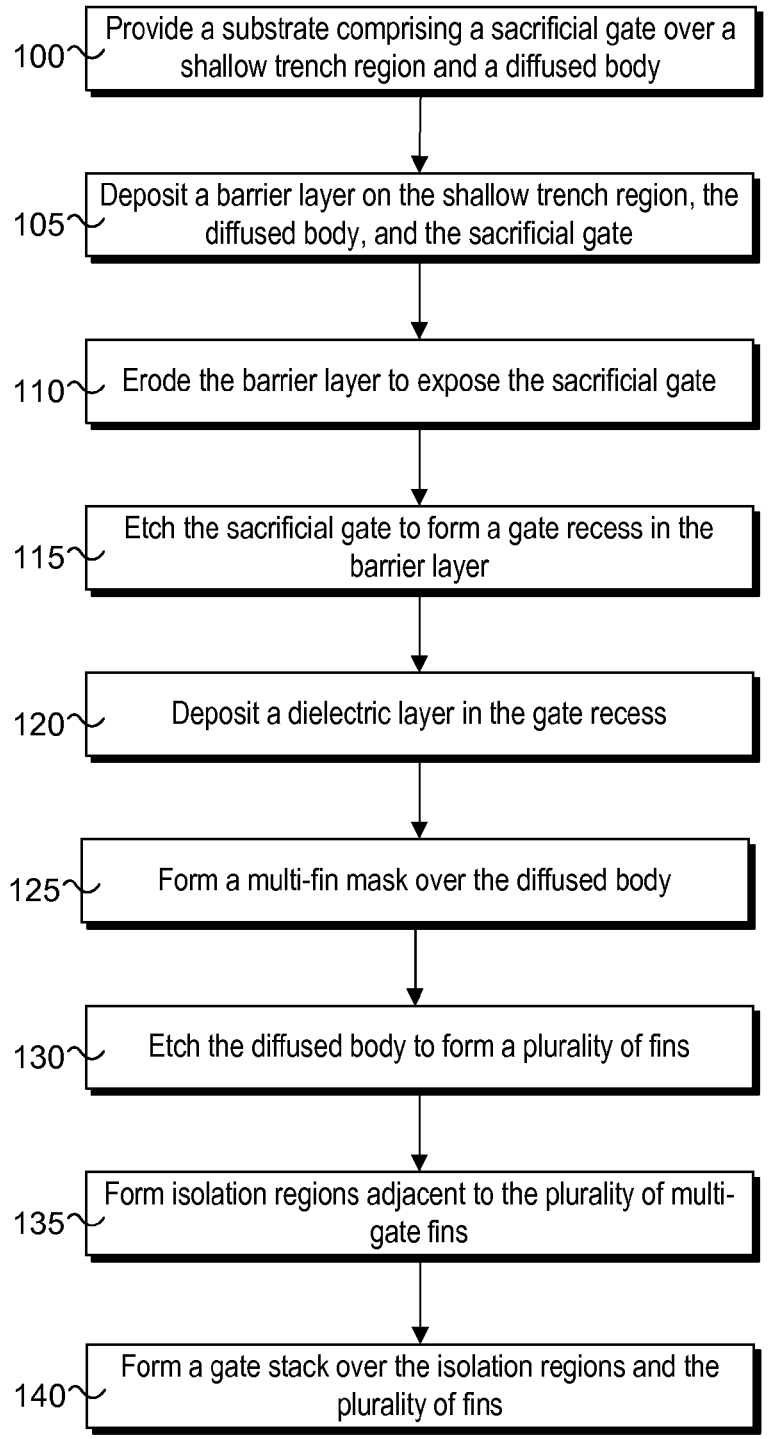
FIG. 1 is a flowchart describing an embodiment of a fabrication process used to form a multi-fin multi-gate device with reduced parasitic contact resistance and enhanced channel mobility.

Turning now to the figures, the illustration in FIG. 1 is a flowchart describing an embodiment of a fabrication process used to form a multi-fin multi-gate device with reduced parasitic contact resistance and enhanced channel mobility. In element 100, a substrate is provided comprising a sacrificial gate over a shallow trench region and a diffused body. In element 105, a barrier layer is deposited on the shallow trench region, the diffused body, and the sacrificial gate. The barrier layer is eroded in element 110 to expose the sacrificial gate. In element 115, the sacrificial gate is etched to form a gate recess in the barrier layer. A dielectric layer is deposited in element 120 in the gate recess. In element 125, a multi-fin mask is formed over the diffused body. In element 130, the diffused body is etched to form a plurality of fins. Isolation regions are formed adjacent to the plurality of multi-gate fins in element 135 and a gate stack is formed over the isolation regions and the plurality of fins in element 140.

Figure 2:
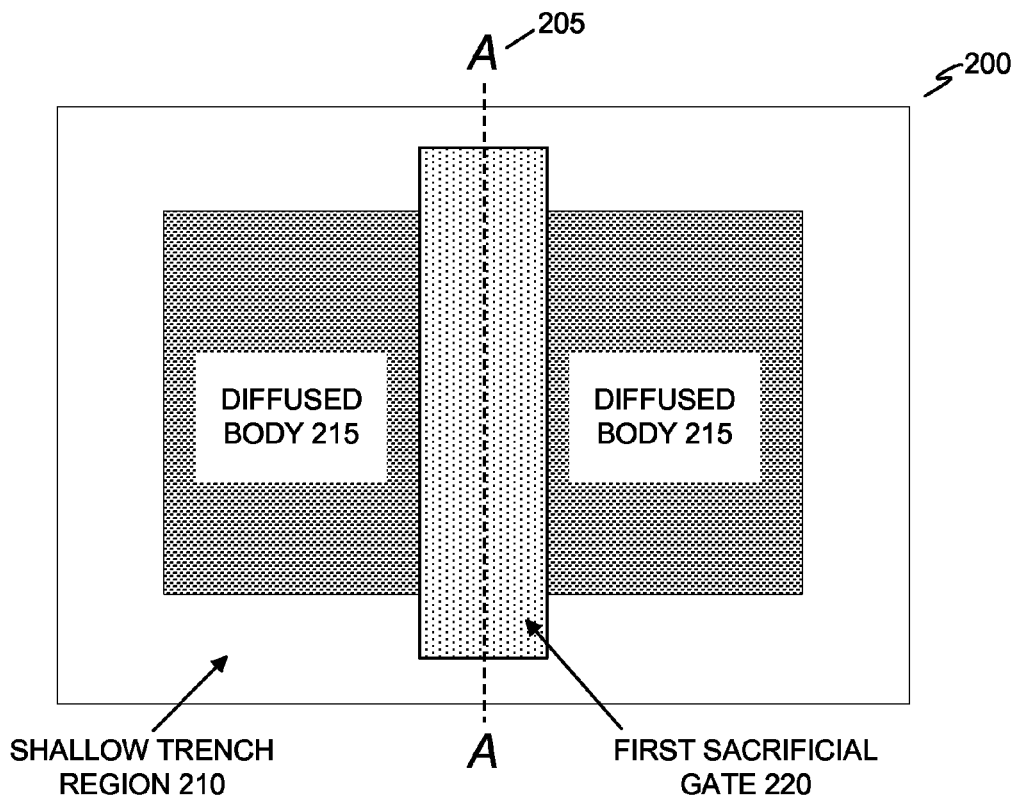
FIG. 2 is a plan layout view of a diffused body surrounded by a shallow trench region and a sacrificial gate formed over the diffused body and shallow trench region.

FIG. 2 is a plan layout view of a multi-gate device 200 with a diffused body 215 surrounded by a shallow trench region 210 and a first sacrificial gate 220 formed over the diffused body 215 and shallow trench region 210. The diffused body 215 is doped to a positive (p) type or negative (n) type conductivity with a concentration level between $1\times10^{16}$ to $1\times10^{19}$ atoms/cm$^3$ as an in-situ doped (i.e., doped while it is deposited) layer using a doped epitaxy process. Alternately, the diffused body 215 may be doped after it is formed on a substrate 305 using a thermal diffusion process, or an ion implantation or gas cluster ion beam (GCIB) infusion process followed by a thermal treatment. Doping after formation enables both positive channel metal oxide semiconductor (PMOS) and negative channel metal oxide semiconductor (NMOS) tri-gate devices to be fabricated easily on the same insulating substrate. The diffused body 215 has a thickness of less than 30 nanometers and ideally less than 20 nanometers. In an embodiment of the present invention, the diffused body 215 is formed to the thickness approximately equal to the gate "length" desired of the fabricated tri-gate transistor.

Figure 3:
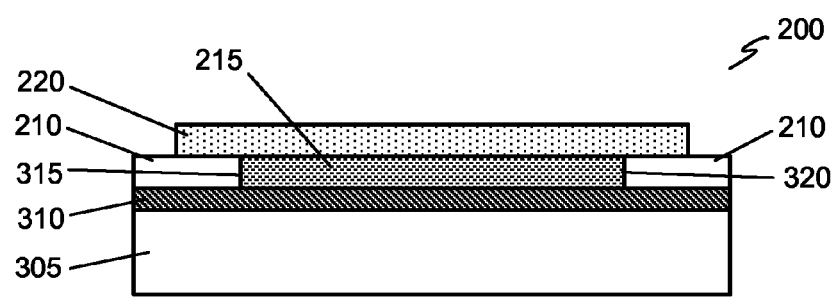
FIG. 3 is a cross-sectional view of FIG. 2 taken through section line A-A illustrating the device in FIG. 2.

FIG. 3 is a cross-sectional view of FIG. 2 taken through section line A-A 205 illustrating the multi-gate device 200 in FIG. 2. The multi-gate device 200 includes a diffused body 215 formed on an insulator 310 on substrate 305, however the embodiment is not so limited. In another embodiment (not shown), the diffused body 215 is formed immediately adjacent to the substrate 305. In a further embodiment (not shown), the diffused body 215 is formed in the substrate 305. Diffused body 215 can be formed of any well-known semiconductor material, such as but not limited to silicon (Si), germanium (Ge), silicon germanium (Si$_x$Ge$_y$), gallium arsenide (GaAs), indium antimonide (InSb), gallium phosphide (GaP), gallium antimonide (GaSb), and carbon nanotubes.

Diffused body 215 can be formed of any well-known material which can be reversibly altered from an insulating state to a conductive state by applying external electrical controls. In one embodiment, the diffused body 215 is a single crystalline film when the best electrical performance of multi-gate device 200 is desired. For example, diffused body 215 is a single crystalline film when multi-gate device 200 is used in high performance applications, such as in a high density circuit, such as a microprocessor. Alternately, the diffused body 215 is a polycrystalline film when multi-gate device 200 is used in applications requiring less stringent performance, such as in liquid crystal displays. Insulator 310, such as silicon dioxide, insulates diffused body 215 from substrate 305, which may be monocrystalline Si, Ge, Si$_x$Ge$_y$, GaAs, InSb, GaP, GaSb.

In an embodiment of the present invention, diffused body 215 is a single crystalline silicon film. Diffused body 215 has a pair of laterally opposite sidewalls 315 and 320 adjacent to the shallow trench region 210. The shallow trench region 210 may be formed of an insulating film such as a silicon oxide, silicon nitride, or a low k dielectric (e.g., k<3) such as carbon-doped oxide (CDO). The first sacrificial gate 220 formed over the diffused body 215 and shallow trench region 210 may be a polysilicon layer formed using lithography techniques known to one skilled in the art.

Figure 4:
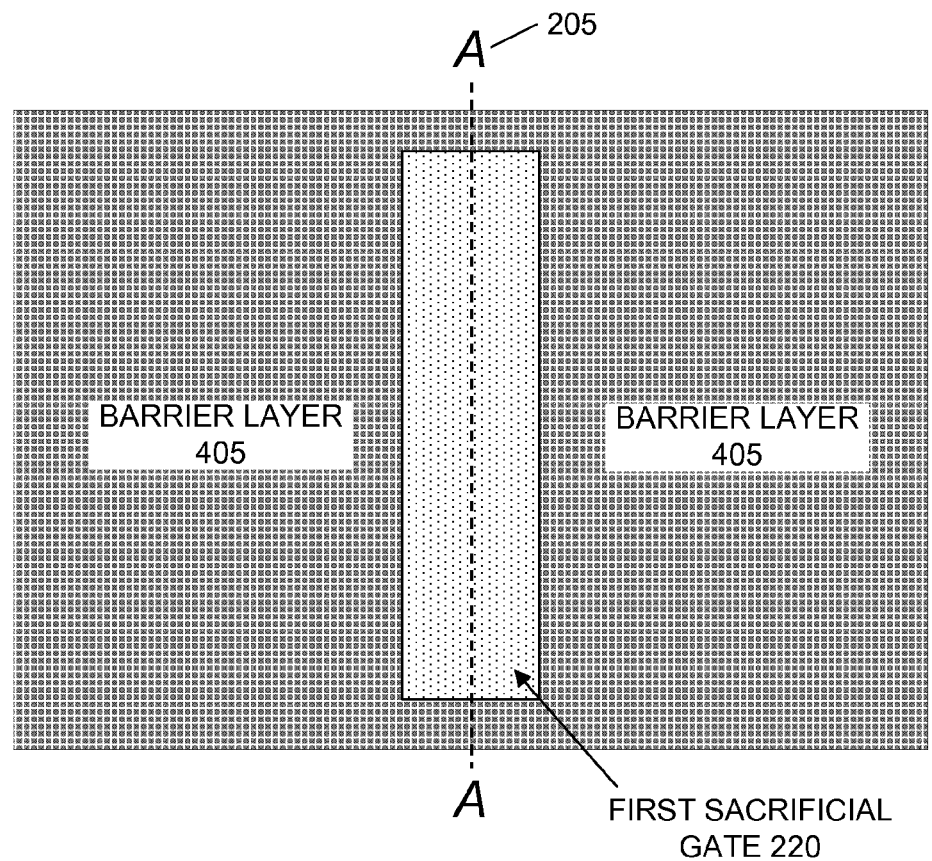
FIG. 4 illustrates the device of FIG. 2 after forming a barrier layer on the multi-gate device and planarizing the barrier layer to expose the first sacrificial gate.
Figure 5:
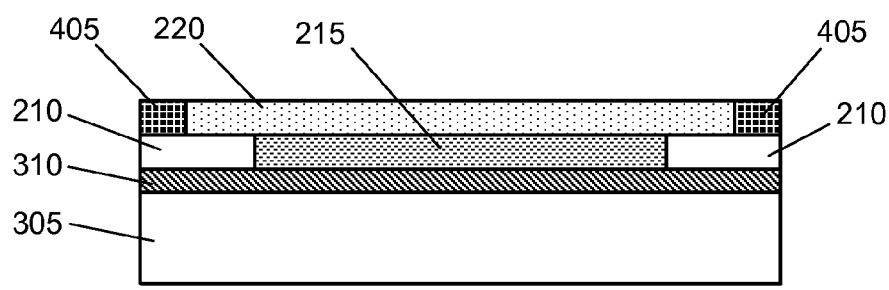
FIG. 5 is a cross-sectional view of FIG. 4 taken through section line A-A illustrating the device in FIG. 4.

FIG. 4 illustrates the device of FIG. 2 after forming a barrier layer 405 on the multi-gate device 200 and planarizing the barrier layer 405 to expose the first sacrificial gate 220. The barrier layer 405 can be formed by blanket depositing a conformal film, such as but not limited to silicon nitride, silicon oxide, silicon oxynitride or combination thereof over the substrate 305. In an embodiment of the present invention, the barrier layer 405 is a silicon nitride film formed by a hot wall low-pressure chemical vapor deposition (LPCVD) process. In another embodiment, the barrier layer 405 is deposited using plasma enhanced chemical vapor deposition (PECVD), high density chemical vapor deposition (HDCVD), and/or a sputtering process. The barrier layer 405 is planarized using well-known smoothing techniques, such as chemical mechanical polishing (CMP), which can be used to planarize the barrier layer 405 and expose the first sacrificial gate 220. The planarization process erodes a top portion of the barrier layer 405 to create a uniform, substantially planar surface while improving the optical resolution of subsequent lithography steps. FIG. 5 is a cross-sectional view of FIG. 4 taken through section line A-A 205 illustrating the multi-gate device in FIG. 4.

Figure 6:
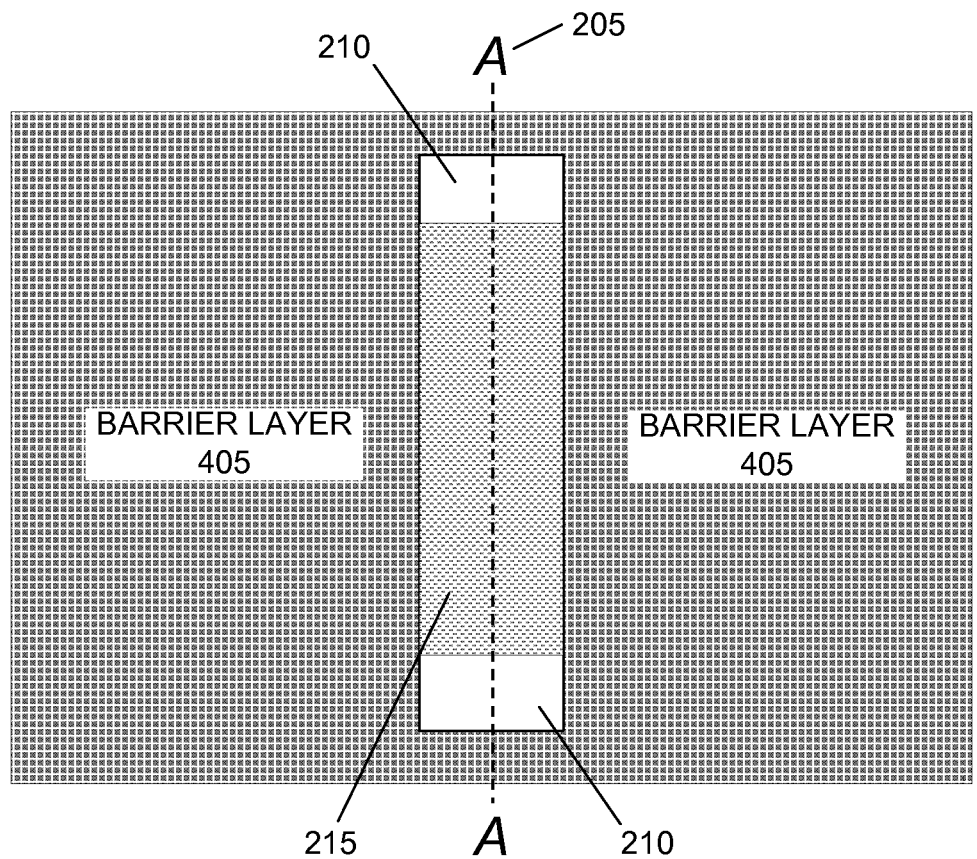
FIG. 6 illustrates the device of FIG. 4 after etching the first sacrificial gate to form a recess in the barrier layer.
Figure 7:
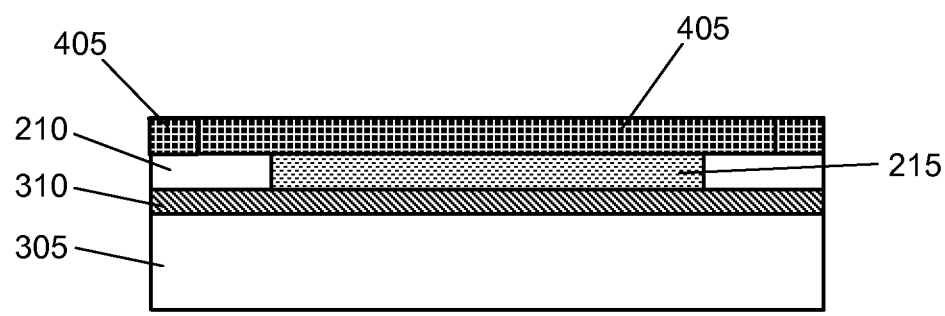
FIG. 7 is a cross-sectional view of FIG. 6 taken through section line A-A illustrating the device in FIG. 6.

FIG. 6 illustrates the multi-gate device 200 of FIG. 4 after etching the first sacrificial gate 220 (FIG. 4) to form a recess in the barrier layer 405. The recess in the barrier layer, exposing the shallow trench region 210 and the diffused body 215 may be formed by etching the first sacrificial gate 220 isotropically, meaning that a rate of etching is substantially the same in any direction and largely non-directional, which is typical of a wet-etch process. The appropriate wet-etch process is selectively designed to erode the shallow trench region 210 without significantly eroding the barrier layer 405, the shallow trench region 210, or the diffused body 215. In another embodiment, the first sacrificial gate 220 is removed anisotropically, meaning that an etch rate in the direction normal to a surface is much higher than in a direction parallel to the surface. The first sacrificial gate 220 may be eroded using sulfur hexafluoride (SF6), oxygen (O2), carbon monoxide (CO), and argon (Ar), or a fluorinated hydrocarbon (CHxFy) gas in a magnetically enhanced reactive ion etch (MERIE) or an electron cyclotron resonance (ECR) chamber or tool. FIG. 7 is a cross-sectional view of FIG. 6 taken through section line A-A 205 illustrating the multi-gate device 200 in FIG. 6.

Figure 8:
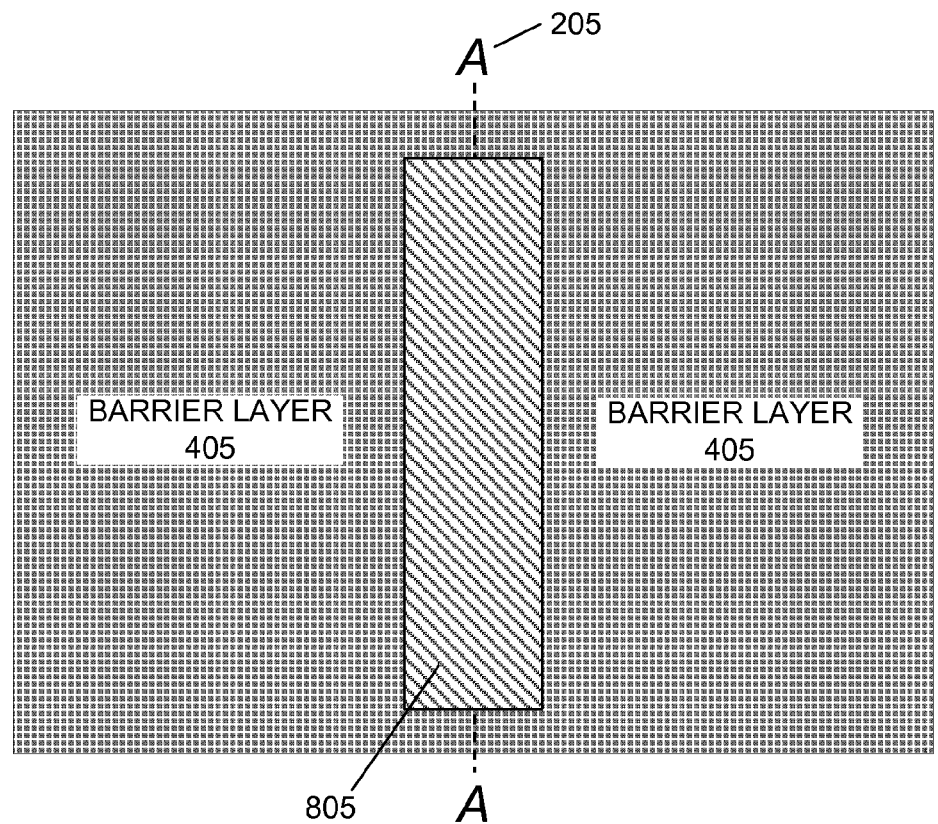
FIG. 8 illustrates the device of FIG. 6 after forming a second sacrificial gate layer in the barrier layer recess.
Figure 9:
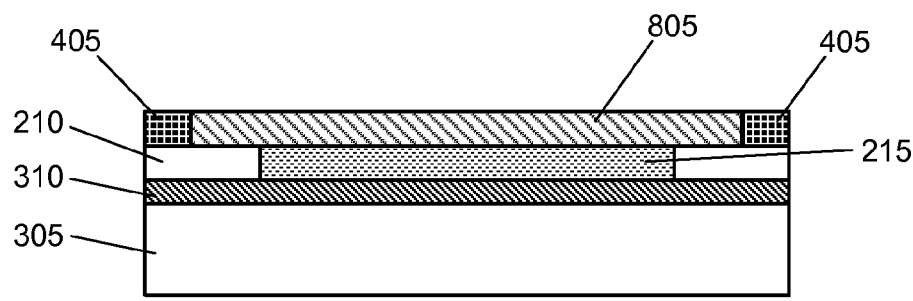
FIG. 9 is a cross-sectional view of FIG. 8 taken through section line A-A illustrating the device in FIG. 8.

FIG. 8 illustrates the multi-gate device 200 of FIG. 6 after forming a second sacrificial gate layer 805 over the shallow trench region 210 and the diffused body 215. The second sacrificial gate 805 may be a dielectric layer comprising silicon nitride, silicon oxide, silicon oxynitride, polysilicon or combination thereof. The second sacrificial gate layer 805 is planarized using well-known smoothing techniques, such as chemical mechanical polishing (CMP), which can be used to planarize the second sacrificial gate layer 805 so that it is substantially coplanar with the barrier layer 405. FIG. 9 is a cross-sectional view of FIG. 8 taken through section line A-A 205 illustrating the multi-gate device in FIG. 8.

Figure 10:
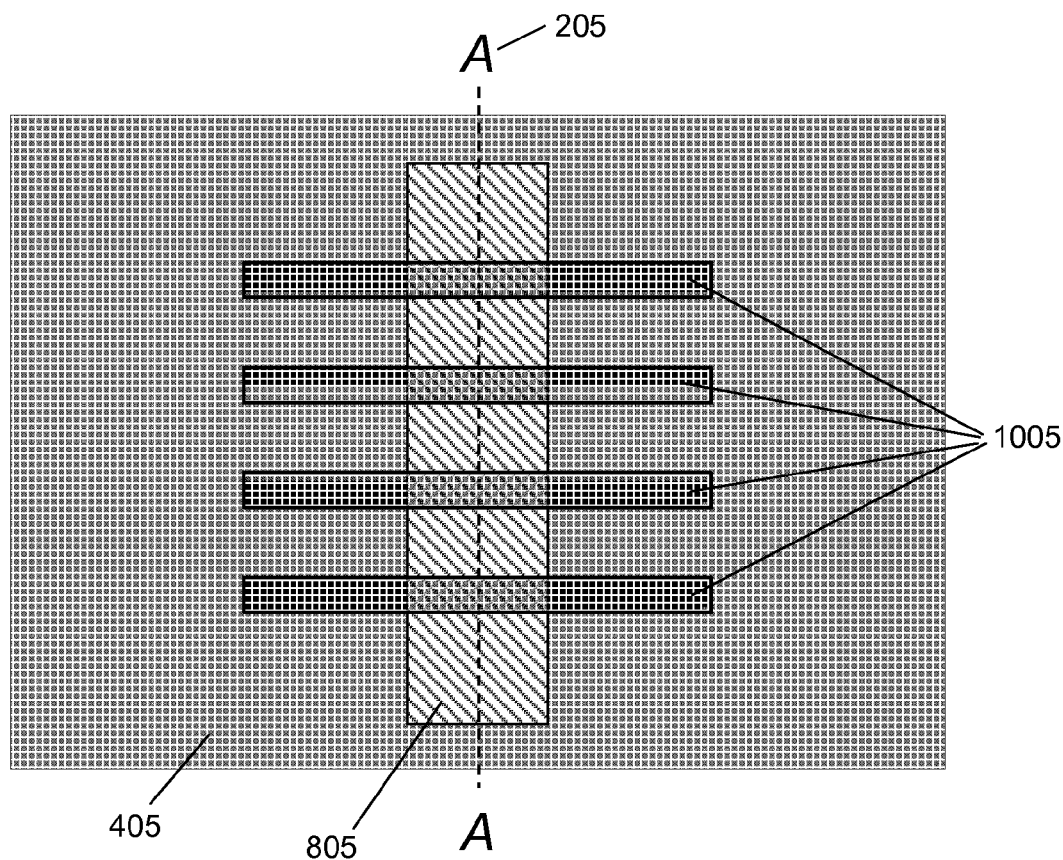
FIG. 10 illustrates the device of FIG. 8 after forming a multi-fin hard mask over the second sacrificial gate layer.
Figure 11:
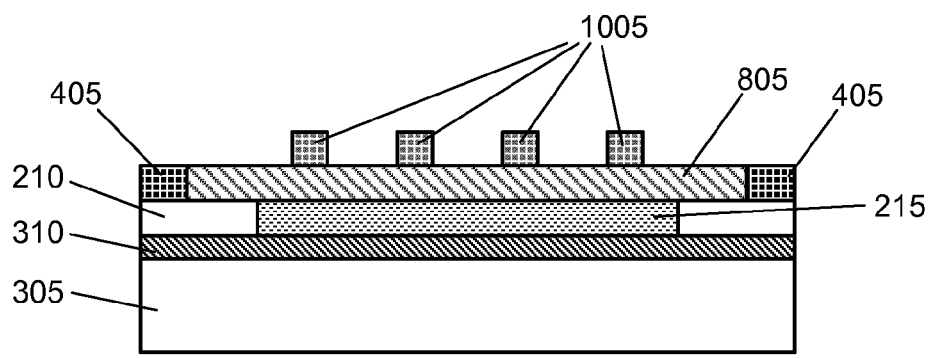
FIG. 11 is a cross-sectional view of FIG. 10 taken through section line A-A illustrating the device in FIG. 10.

FIG. 10 illustrates the multi-gate device of FIG. 8 after forming a multi-fin mask 1005 over the second sacrificial gate 805 layer. The multi-fin mask 1005 may be formed of the same material as the barrier layer 405 by blanket depositing a conformal film over the barrier layer 405 and second sacrificial gate 805. In another embodiment, the multi-fin mask 1005 may comprise silicon nitride, silicon oxide, silicon oxynitride or combination thereof. The multi-fin mask 1005 may be formed using lithography techniques known to one skilled in the art of semiconductor manufacturing. FIG. 11 is a cross-sectional view of FIG. 10 taken through section line A-A 205 illustrating the multi-gate device in FIG. 10.

Figure 12:
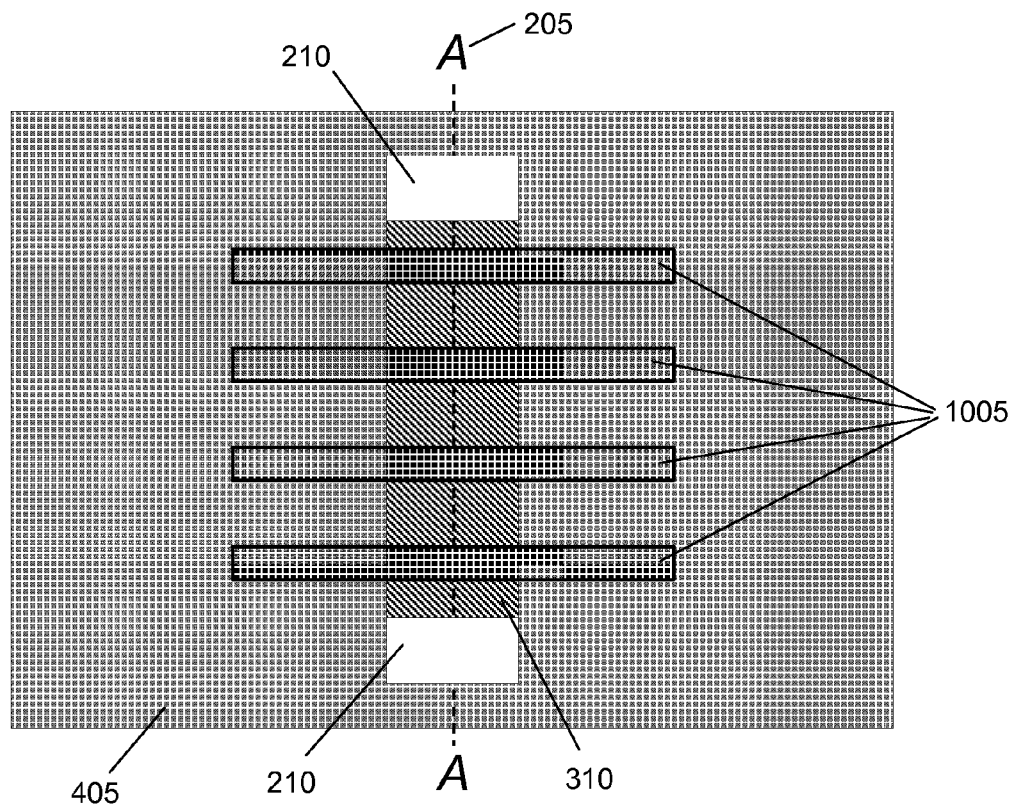
FIG. 12 illustrates the device of FIG. 10 after anisotropically etching the second sacrificial gate layer and diffused body through the hard mask to form a plurality of multi-gate fins.

FIG. 12 illustrates the multi-gate device of FIG. 10 after anisotropically etching the second sacrificial gate 805 layer and the diffused body 215 through the multi-fin mask 1005 to form a plurality of multi-gate fins 1305. The appropriate anisotropic etch process is selectively designed to erode the second sacrificial gate 805 and diffused body 215 (FIG. 2) without significantly eroding the barrier layer 405, the multi-fin mask 1005, the shallow trench region 210, or the insulator 310.

Figure 13:
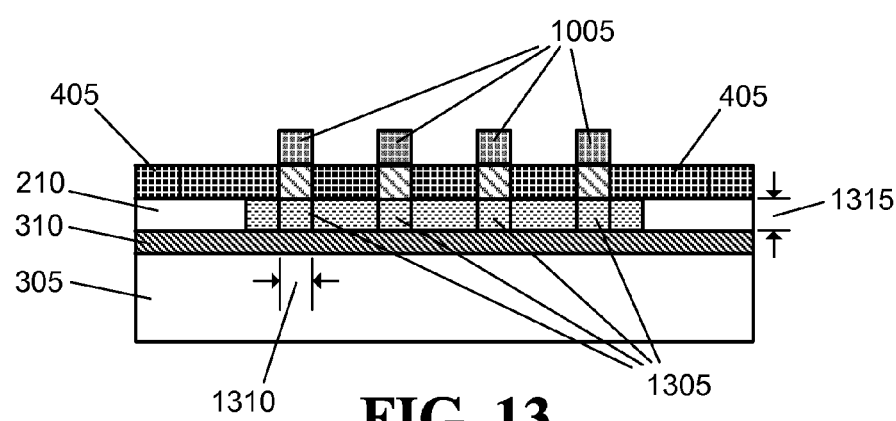
FIG. 13 is a cross-sectional view of FIG. 12 taken through section line A-A illustrating the device in FIG. 12.

FIG. 13 is a cross-sectional view of FIG. 12 taken through section line A-A 205 illustrating the multi-gate device 200 in FIG. 12. Diffused body 215 is etched to form the multi-gate fins 1305, until the underlying insulator 310 is exposed. Well-known semiconductor etching techniques, such as plasma etching or reactive ion etching can be used to form the multi-gate fins 1305. The multi-fin mask 1005 defines the width 1310 desired of the subsequently formed multi-gate fins 1305, or fins of the tri-gate transistor. In an embodiment of the present invention, the multi-gate fins 1305 will have a fin width 1310 less than or equal to 30 nanometers and ideally less than or equal to 20 nanometers. Also, the diffused body has a thickness, otherwise referred to as the multi-gate fin height 1315, of less than 30 nanometers and ideally less than or equal to 20 nanometers. In an embodiment of the present invention, the multi-fin mask 1005 for the multi-gate fins 1305 have a width 1310 approximately equal to a multi-gate fin height 1315.

Figure 14:
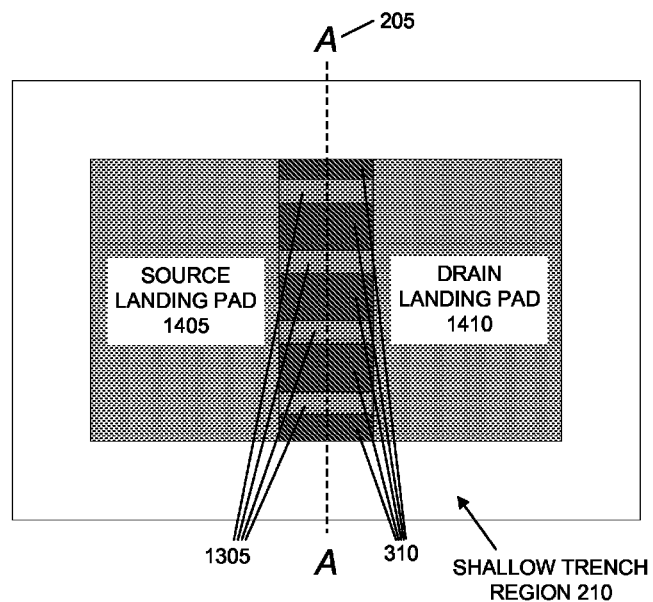
FIG. 14 illustrates the device of FIG. 12 after removing the multi-fin hard mask and barrier layer.
Figure 15:
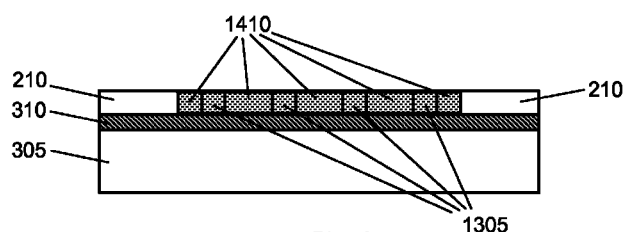
FIG. 15 is a cross-sectional view of FIG. 14 taken through section line A-A illustrating the device in FIG. 14.

FIG. 14 illustrates the multi-gate device of FIG. 12 after removing the multi-fin mask 1005, any remaining artifacts of the second sacrificial gate 805 layer, and the barrier layer 405. In one embodiment, the multi-fin mask 1005, any remaining artifacts of the second sacrificial gate 805 layer, and the barrier layer 405 are eroded using a CMP process. FIG. 15 is a cross-sectional view of FIG. 14 taken through section line A-A 205 illustrating the multi-gate device in FIG. 14.

Figure 16:
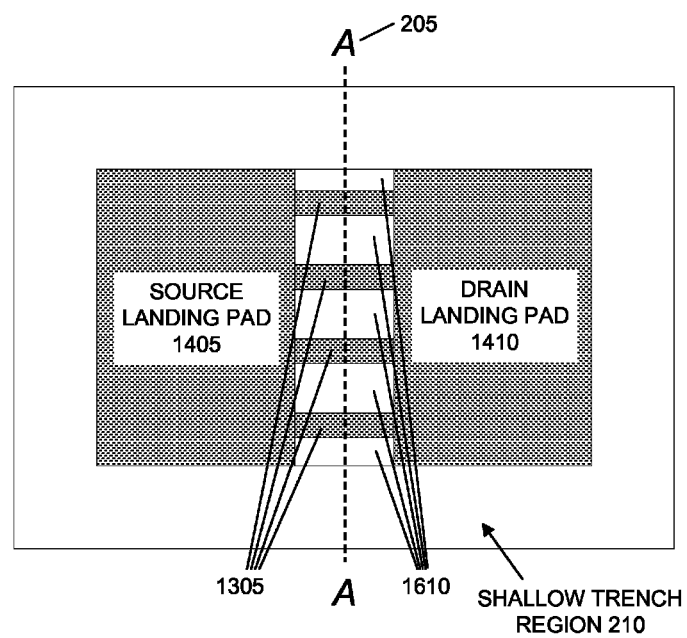
FIG. 16 illustrates the device of FIG. 14 after forming isolated regions adjacent to the multi-gate fins.

FIG. 16 illustrates the device of FIG. 14 after forming isolated regions 1610 adjacent to the multi-gate fins 1305. The isolated regions 1610 are formed by first depositing a conformal film on the exposed areas of shallow trench region 210, insulator 310 and multi-gate fins 1305, planarizing the dielectric layer, and etching the dielectric layer. The conformal film may be formed of silicon nitride, silicon oxide, silicon oxynitride or combination thereof and planarized using well-known smoothing techniques, such as CMP.

Figure 17:
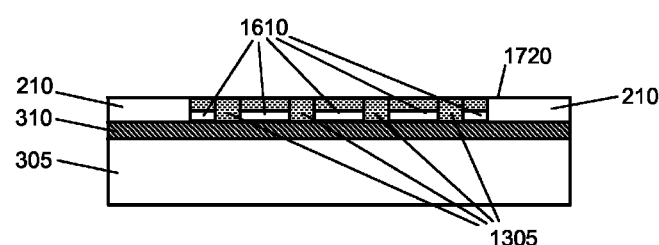
FIG. 17 is a cross-sectional view of FIG. 16 taken through section line A-A illustrating the device in FIG. 16.

FIG. 17 is a cross-sectional view of FIG. 16 taken through section line A-A illustrating the device in FIG. 16. In one embodiment, the conformal film is etched to form the isolated regions 1610 using a timed isotropic wet etch comprising hydrogen fluoride and water. The isolated regions 1610 are recessed below a shallow trench region top surface 1720 to a depth of greater than or equal to 10 nanometers and less than or equal to 100 nanometers.

Figure 18:
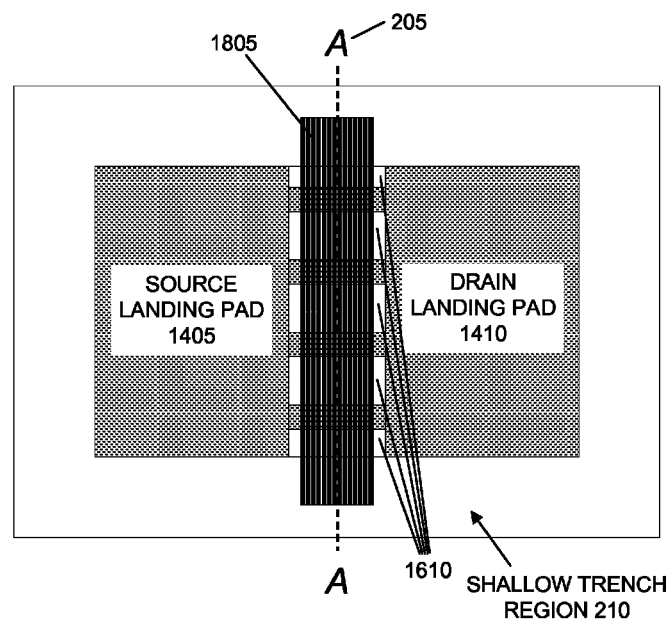
FIG. 18 illustrates the device of FIG. 16 after forming a gate electrode on the multi-gate fins.
Figure 19:
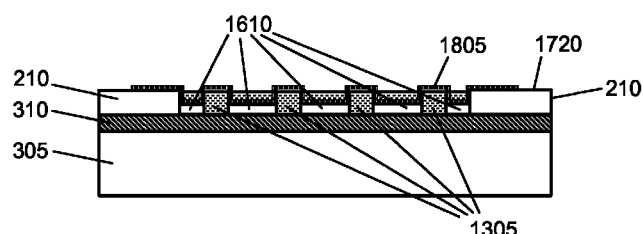
FIG. 19 is a cross-sectional view of FIG. 18 taken through section line A-A illustrating the device in FIG. 18.

FIG. 18 illustrates the multi-gate device of FIG. 16 after forming a gate stack 1805 on the multi-gate fins 1305 and the isolated regions 1610. In one embodiment, the gate stack 1805 comprises a gate dielectric layer and a gate electrode. Gate dielectric layer is formed on and around three sides of the multi-gate fins 1305 and the isolated regions 1610 as shown in FIG. 19. The gate dielectric layer can be any well-known gate dielectric layer. In an embodiment of the present invention, the gate dielectric layer is a silicon dioxide ($SiO_2$), silicon oxynitride ($SiO_xN_y$) or a silicon nitride ($Si_3N_4$) dielectric layer. In another embodiment of the present invention, the gate dielectric layer is a silicon oxynitride film formed to a thickness of between 5-20 Å. In one embodiment, the gate dielectric layer is a high K gate dielectric layer, such as a metal oxide dielectric, such as but not limited to tantalum pentoxide ($Ta_2O_5$), and titanium oxide ($TiO_2$). The gate dielectric layer can be other types of high K dielectric, such as lanthanum oxide, hafnium oxide, zirconium oxide, lead-zirconate-titanate, barium-strontium-titanate, or aluminum oxide.

The gate stack 1805 also comprises the gate electrode formed of any suitable gate electrode material. In an embodiment of the present invention the gate electrode comprises of polycrystalline silicon doped to a concentration density between $1\times10^{19}$ atoms/cm$^3$-$1\times10^{20}$ atoms/cm$^3$. In another embodiment of the present invention the gate electrode can be a metal gate electrode, such as but not limited to, tungsten, tantalum, titanium, and their nitrides. In one embodiment of the present invention the gate electrode is formed from a material having a mid-gap work function between 4.6-4.8 electron-volts (eV). It is to be appreciated, the gate electrode need not necessarily be a single material and can be a composite stack of thin films, such as but not limited to a polycrystalline silicon/metal electrode or a metal/polycrystalline silicon electrode. Sidewall spacers (not shown) may be formed on or more surfaces adjacent to the gate stack 1805, for example, opposite the source landing pad 1405 and/or the drain landing pad 1410. The sidewall spacers, formed from silicon nitride or silicon oxide or composites thereof, run along the laterally opposite sidewalls of the gate stack 1805. An embodiment of the present invention sidewalls spacers have a thickness of between 20-200 Å. The resulting structure shown in FIG. 19 provides a dogbone diffusion formation, which generally provides a significantly larger area for low resistance epi-fin contact formation compared to conventional trigate devices. In addition, the solid dogbone diffusion allows for increased strain transfer into each channel, as the amount of free epi surface (where strain can relax) are significantly reduced over conventional trigate transistors.

A plurality of embodiments of an apparatus and methods for improving multi-gate device performance has been described. The foregoing description of the embodiments of the invention has been presented for the purposes of illustration and description. It is not intended to be exhaustive or to limit the invention to the precise forms disclosed. This description and the claims following include terms, such as left, right, top, bottom, over, under, upper, lower, first, second, etc. that are used for descriptive purposes only and are not to be construed as limiting. For example, terms designating relative vertical position refer to a situation where a device side (or active surface) of a substrate or integrated circuit is the "top" surface of that substrate; the substrate may actually be in any orientation so that a "top" side of a substrate may be lower than the "bottom" side in a standard terrestrial frame of reference and still fall within the meaning of the term "top." The term "on" as used herein (including in the claims) does not indicate that a first layer "on" a second layer is directly on and in immediate contact with the second layer unless such is specifically stated; there may be a third layer or other structure between the first layer and the second layer on the first layer. The embodiments of a device or article described herein can be manufactured, used, or shipped in a number of positions and orientations.

However, one skilled in the relevant art will recognize that the various embodiments may be practiced without one or more of the specific details, or with other replacement and/or additional methods, materials, or components. In other instances, well-known structures, materials, or operations are not shown or described in detail to avoid obscuring aspects of various embodiments of the invention. Similarly, for purposes of explanation, specific numbers, materials, and configurations are set forth in order to provide a thorough understanding of the invention. Nevertheless, the invention may be practiced without specific details. Furthermore, it is understood that the various embodiments shown in the figures are illustrative representations and are not necessarily drawn to scale.

Reference throughout this specification to "one embodiment" or "an embodiment" means that a particular feature, structure, material, or characteristic described in connection with the embodiment is included in at least one embodiment of the invention, but do not denote that they are present in every embodiment. Thus, the appearances of the phrases "in one embodiment" or "in an embodiment" in various places throughout this specification are not necessarily referring to the same embodiment of the invention. Furthermore, the particular features, structures, materials, or characteristics may be combined in any suitable manner in one or more embodiments. Various additional layers and/or structures may be included and/or described features may be omitted in other embodiments.

Various operations will be described as multiple discrete operations in turn, in a manner that is most helpful in understanding the invention. However, the order of description should not be construed as to imply that these operations are necessarily order dependent. In particular, these operations need not be performed in the order of presentation. Operations described may be performed in a different order than the described embodiment. Various additional operations may be performed and/or described operations may be omitted in additional embodiments.

Persons skilled in the relevant art can appreciate that many modifications and variations are possible in light of the above teaching. Persons skilled in the art will recognize various equivalent combinations and substitutions for various components shown in the Figures. It is therefore intended that the scope of the invention be limited not by this detailed description, but rather by the claims appended hereto.

What is claimed is:

1. A non-planar transistor device, comprising:
    a single rectangular source region and a single rectangular drain region;
    a plurality of non-planar semiconductor structures extending between and coupling the single rectangular source region to the single rectangular drain region, wherein each non-planar semiconductor structure comprises a plurality of gates;
    a single gate stack positioned between the single rectangular source region and the single rectangular drain region, in contact with the plurality of non-planar semiconductor structures, wherein the single gate stack comprises a gate dielectric and a gate electrode; and
    a shallow trench dielectric region that is planar with and surrounding both the single rectangular source region and the single rectangular drain region.

2. The non-planar transistor device of claim 1, wherein the single rectangular source region and the single rectangular drain region comprise silicon.

3. The non-planar transistor device of claim 1, further including an underlaying insulator, wherein the plurality of non-planar semiconductor structures are adjacent the underlaying insulator.

4. The non-planar transistor device of claim 3, further including a substrate, wherein the underlaying insulator is adjacent the substrate.

5. The non-planar transistor device of claim 1, wherein the plurality of non-planar semiconductor structures comprise a plurality of fins.

6. The non-planar transistor device of claim 5, wherein at least one of the plurality of fins has a thickness of less than 30 nanometers.

7. The non-planar transistor device of claim 1, wherein the gate dielectric comprises a high K dielectric.

8. The non-planar transistor device of claim 1, wherein the gate electrode comprises a metal gate electrode.

9. The non-planar transistor device of claim 1, wherein the gate electrode comprises a composite stack of polycrystalline silicon and mid-gap work function metal.

* * * * *